(12) United States Patent
Tanishita et al.

(10) Patent No.: US 11,121,095 B2
(45) Date of Patent: Sep. 14, 2021

(54) SEMICONDUCTOR DEVICE HAVING ELECTROMAGNETIC WAVE ABSORBING LAYER WITH HEAT DISSIPATING VIAS

(71) Applicant: Mitsubishi Electric Corporation, Tokyo (JP)

(72) Inventors: Tomohiro Tanishita, Tokyo (JP); Tsuneo Hamaguchi, Tokyo (JP); Kiyoshi Ishida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 195 days.

(21) Appl. No.: 16/463,660

(22) PCT Filed: Dec. 15, 2017

(86) PCT No.: PCT/JP2017/045069
§ 371 (c)(1),
(2) Date: May 23, 2019

(87) PCT Pub. No.: WO2018/116974
PCT Pub. Date: Jun. 28, 2018

(65) Prior Publication Data
US 2021/0111130 A1    Apr. 15, 2021

(30) Foreign Application Priority Data
Dec. 21, 2016  (JP) .............................. JP2016-247716

(51) Int. Cl.
*H01L 23/552*    (2006.01)
*H01L 23/29*    (2006.01)
(Continued)

(52) U.S. Cl.
CPC ........ *H01L 23/552* (2013.01); *H01L 21/4853* (2013.01); *H01L 21/565* (2013.01);
(Continued)

(58) Field of Classification Search
CPC . H01L 23/533; H01L 23/295; H01L 23/3121; H01L 23/3135; H01L 24/16;
(Continued)

(56) References Cited

U.S. PATENT DOCUMENTS 8,415,568 B1 *  4/2013  Hansen ................ H05K 9/0007
                                                    174/386
9,972,579 B1 *  5/2018  Kawabata ................ H01F 1/26
(Continued)

FOREIGN PATENT DOCUMENTS

JP    7003195 U    1/1995
JP    8031989 A    2/1996
(Continued)

*Primary Examiner* — Alexander O Williams
(74) *Attorney, Agent, or Firm* — Buchanan Ingersoll & Rooney PC

(57) ABSTRACT

A semiconductor device is provided that has high electromagnetic wave shielding properties while exhibiting good heat dissipation. The semiconductor device includes a semiconductor package bonded onto a circuit board, an electromagnetic wave absorbing layer covering surfaces of the semiconductor package other than a surface bonded to the circuit board, and an electromagnetic wave reflecting layer covering the electromagnetic wave absorbing layer on a side remote from the semiconductor package, in which the electromagnetic wave absorbing layer is made of resin containing magnetic particles or carbon, and the electromagnetic wave reflecting layer is made of resin containing conductive particles.

6 Claims, 18 Drawing Sheets

(51) Int. Cl.
*H01L 23/31* (2006.01)
*H01L 23/00* (2006.01)
*H01L 21/48* (2006.01)
*H01L 21/56* (2006.01)
*H01L 23/373* (2006.01)

(52) U.S. Cl.
CPC ........ *H01L 23/295* (2013.01); *H01L 23/3121* (2013.01); *H01L 23/3135* (2013.01); *H01L 23/3733* (2013.01); *H01L 24/16* (2013.01); *H01L 2224/16155* (2013.01); *H01L 2924/3025* (2013.01)

(58) Field of Classification Search
CPC ............... H01L 21/4853; H01L 21/565; H01L 23/3733; H01L 2924/3025; H01L 2224/16155; H01L 23/29; H01L 12/31; H01L 23/00; H01L 21/48; H01L 21/56; H01L 23/373
USPC ......................................................... 257/679
See application file for complete search history.

(56) References Cited

U.S. PATENT DOCUMENTS

| | | | |
|---|---|---|---|
| 2003/0107025 A1 | 6/2003 | Okayama et al. | |
| 2003/0155143 A1* | 8/2003 | Fujieda | B82Y 30/00 174/354 |
| 2003/0190498 A1* | 10/2003 | Fujieda | H01Q 17/001 428/8 |
| 2009/0166819 A1* | 7/2009 | Chen | H01L 23/552 257/659 |
| 2014/0327356 A1* | 11/2014 | Nakai | H05B 33/04 315/34 |
| 2015/0163958 A1* | 6/2015 | Oguma | H05K 7/20463 264/36.22 |
| 2017/0090532 A1* | 3/2017 | Koukami | H05K 1/181 |
| 2017/0092633 A1* | 3/2017 | Tomonari | H01L 21/561 |
| 2017/0278804 A1* | 9/2017 | Kawabata | H01L 23/49805 |
| 2017/0294387 A1* | 10/2017 | Kawabata | H01L 23/49838 |
| 2017/0301628 A1* | 10/2017 | Kawabata | H01L 23/49838 |
| 2017/0309576 A1* | 10/2017 | Kawabata | H01L 25/50 |
| 2018/0033738 A1* | 2/2018 | Kawabata | H01L 24/16 |
| 2018/0103564 A1* | 4/2018 | Saito | H05K 9/006 |
| 2018/0132390 A1* | 5/2018 | Jeong | H01L 23/3135 |
| 2018/0158782 A1* | 6/2018 | Kawabata | H01L 23/295 |
| 2019/0008079 A1* | 1/2019 | Kondo | H05K 9/0022 |
| 2019/0035744 A1* | 1/2019 | Kawabata | H01L 23/552 |
| 2019/0172816 A1* | 6/2019 | Kim | H01L 23/295 |
| 2020/0152581 A1* | 5/2020 | Kumura | H01L 23/552 |
| 2020/0178426 A1* | 6/2020 | Ui | H05K 9/0084 |
| 2020/0194380 A1* | 6/2020 | Kang | H01L 23/295 |

FOREIGN PATENT DOCUMENTS

| | | | | |
|---|---|---|---|---|
| JP | 09-116289 A | * | 5/1997 | ............... H05K 9/00 |
| JP | 9116289 A | | 5/1997 | |
| JP | 2000328006 A | | 11/2000 | |
| JP | 2002158484 A | | 5/2002 | |
| JP | 2007207985 A | | 8/2007 | |
| JP | 2013038162 A | | 2/2013 | |
| JP | 2014157897 A | | 8/2014 | |

* cited by examiner

F I G. 2 5
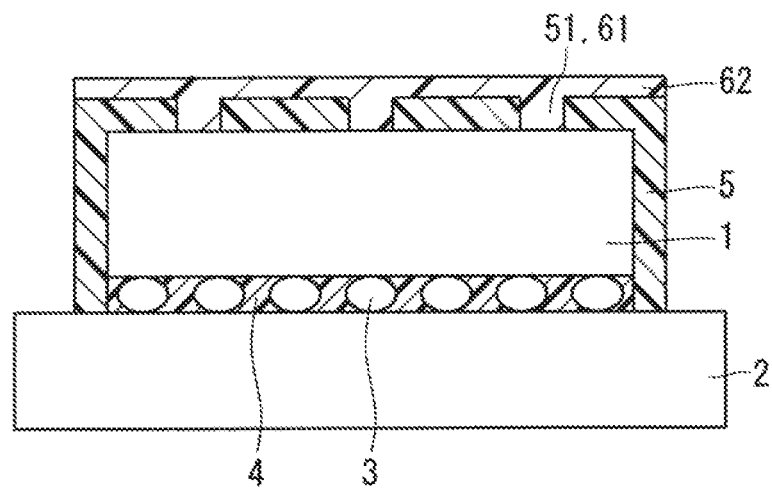
F I G. 2 6
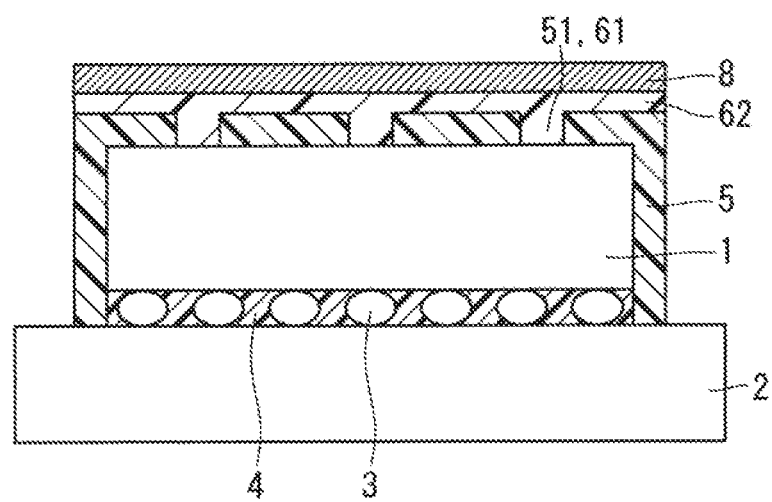

SEMICONDUCTOR DEVICE HAVING ELECTROMAGNETIC WAVE ABSORBING LAYER WITH HEAT DISSIPATING VIAS

TECHNICAL FIELD

The present invention relates to a semiconductor device.

BACKGROUND ART

In recent years, along with higher-speed communication and downsizing of electronic apparatuses, particularly, communication apparatuses, frequencies with which high-frequency semiconductor packages composed of silicon or compound semiconductors are compatible are getting higher. As the frequency with which such a semiconductor package is compatible increases, a problem arises that a malfunction is caused by electromagnetic wave noise. To address such a problem, a practice to cover the semiconductor package with a metal can to shield electromagnetic waves has been widely made.

However, when the semiconductor package is covered with the metal can, the mounting area of the semiconductor package is increased, which causes another problem that mutual interference of electromagnetic waves occurs among the electronic components in the metal can.

Therefore, a structure in which semiconductor packages are each covered with an electromagnetic wave absorbing material or a conductive resin has been proposed. Such an electromagnetic wave absorbing material exhibits an effect of absorbing electromagnetic waves by converting electromagnetic wave energy into thermal energy. Further, the conductive resin exhibits an effect of reflecting electromagnetic waves.

For example, Patent Document 1 discloses a semiconductor device in which each semiconductor package mounted on a printed wiring board is covered with an electromagnetic shielding layer made of an electromagnetic wave absorbing material formed by printing. Here, as the electromagnetic wave absorbing material, a thermosetting paste that results from mixing a magnetic powder such as ferrite into an epoxy resin is used.

PRIOR ART DOCUMENT

Patent Document

Patent Document 1: Japanese Patent Application Laid-Open No. 2000-328006

SUMMARY

Problem to be Solved by the Invention

In the structure disclosed in Patent Document 1, since the semiconductor package is covered only with the electromagnetic shielding layer made of the electromagnetic wave absorbing material, electromagnetic waves may leak from the semiconductor package to the outside. Further, since the thermal conductivity ($\lambda$) of the ferrite particles contained in the electromagnetic wave absorbing material is 1 to 5 W/(m·K), the thermal conductivity of the whole electromagnetic wave absorbing material is 0.1 to 1 W/(m·K), and thus there is a problem that the heat transfer performance is reduced to about $\frac{1}{5}$ as compared with the conductive layer containing the conductive particles.

The present invention has been made to solve the above-described problems, and an object of the present invention is to provide a semiconductor device that has high electromagnetic wave shielding properties while exhibiting good heat dissipation.

Means to Solve the Problem

A semiconductor device according to the present invention includes a semiconductor package bonded onto a circuit board, an electromagnetic wave absorbing layer covering surfaces of the semiconductor package other than a surface bonded to the circuit board, and an electromagnetic wave reflecting layer covering the electromagnetic wave absorbing layer on a side remote from the semiconductor package, in which the electromagnetic wave absorbing layer is made of resin containing magnetic particles or carbon, and the electromagnetic wave reflecting layer is made of resin containing conductive particles.

Effects of the Invention

The semiconductor device according to the present invention includes the semiconductor package bonded onto the circuit board, the electromagnetic wave absorbing layer covering surfaces of the semiconductor package other than a surface bonded to the circuit board, and the electromagnetic wave reflecting layer covering the electromagnetic wave absorbing layer on a side remote from the semiconductor package, in which the electromagnetic wave absorbing layer is made of resin containing magnetic particles or carbon, and the electromagnetic wave reflecting layer is made of resin containing conductive particles. This configuration makes it possible to achieve high electromagnetic wave shielding properties with respect to the semiconductor package and cause heat of the semiconductor package to be efficiently dissipated from the electromagnetic wave reflecting layer.

BRIEF DESCRIPTION OF DRAWINGS

FIG. 25 is a cross-sectional view of the semiconductor device according to the fourth embodiment of the present invention, showing the second method for manufacturing the semiconductor device.

FIG. 26 is a cross-sectional view of the semiconductor device according to the fourth embodiment of the present invention, showing the second method for manufacturing the semiconductor device.

DESCRIPTION OF EMBODIMENTS

A. First Embodiment

Figure 1:
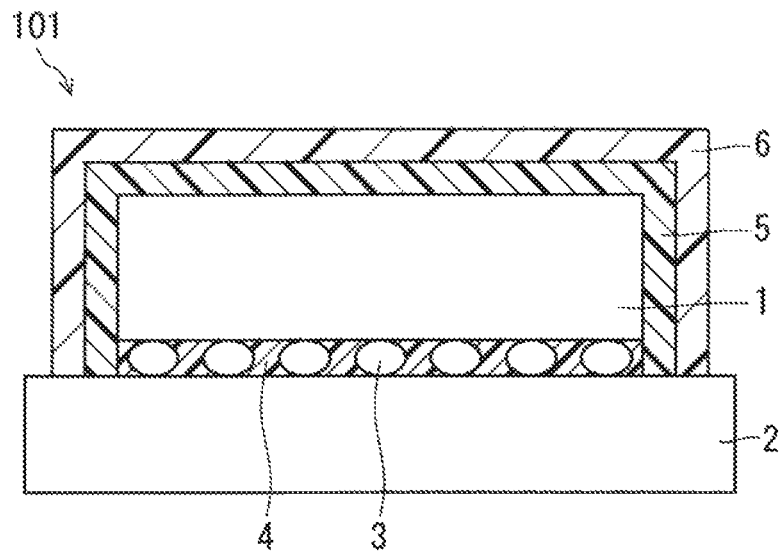
FIG. 1 is a cross-sectional view of a semiconductor device according to a first embodiment of the present invention.

FIG. 1 is a cross-sectional view of a semiconductor device 101 according to a first embodiment of the present invention. In FIG. 1, the semiconductor device 101 includes a semiconductor package 1, a circuit board 2, solder 3, an underfill resin 4, an electromagnetic wave absorbing layer 5, and an electromagnetic wave reflecting layer 6. Herein, a semiconductor element that is composed of a silicon or compound semiconductor and is packaged with resin or the like is referred to as a semiconductor package. The semiconductor package 1 is, for example, an amplification IC or a high power module used in high frequency equipment.

The circuit board 2 is composed of a printed board made of glass epoxy resin and copper wiring, or alumina and silver wiring. Further, in a case where a multilayer board is used for the circuit board 2, the circuit board 2 may have a single patterned layer of Cu.

The semiconductor package 1 is bonded onto the circuit board 2 with the solder 3 and the underfill resin 4.

In the present embodiment, Sn-3Ag-0.5Cu is used for the solder 3, but Sn-3.5Ag, Sn-0.7Cu, or the like may be used instead.

The underfill resin 4 is used to protect a joint portion, formed of the solder 3, between the semiconductor package 1 and the circuit board 2. The underfill resin 4 is made of resin such as an epoxy or urethane resin.

The electromagnetic wave absorbing layer 5 covers all surfaces of the semiconductor package 1 other than a surface bonded to the circuit board 2; that is, the electromagnetic wave absorbing layer 5 covers an upper surface and side surfaces of the semiconductor package 1. The electromagnetic wave absorbing layer 5 is made of resin such as an epoxy or acrylic resin containing magnetic particles such as ferrite or sendust particles, or carbon particles with a content of 50 to 70% by volume.

The electromagnetic wave reflecting layer 6 covers the electromagnetic wave absorbing layer 5 on a side remote from the semiconductor package 1. In other words, the semiconductor package 1 is covered with the electromagnetic wave absorbing layer 5, and the electromagnetic wave absorbing layer 5 is covered with the electromagnetic wave reflecting layer 6. Further, the electromagnetic wave reflecting layer 6 is electrically connected to a ground electrode on the circuit board 2. The electromagnetic wave reflecting layer 6 is made of resin such as an epoxy or acrylic resin containing conductive particles, for example, conductive metal particles such as gold, silver, copper, or aluminum particles with a content of 50 to 70% by volume.

FIG. 2, FIG. 3, FIG. 4, FIG. 5, and FIG. 6 are each a cross-sectional view of the semiconductor device 101, showing a method for manufacturing the semiconductor device 101. Hereinafter, the method for manufacturing the semiconductor device 101 will be described with reference to these drawings.

Figure 2:
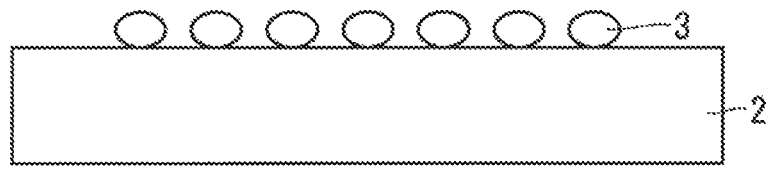
FIG. 2 is a cross-sectional view of the semiconductor device according to the first embodiment of the present invention, showing a method for manufacturing the semiconductor device.
Figure 3:
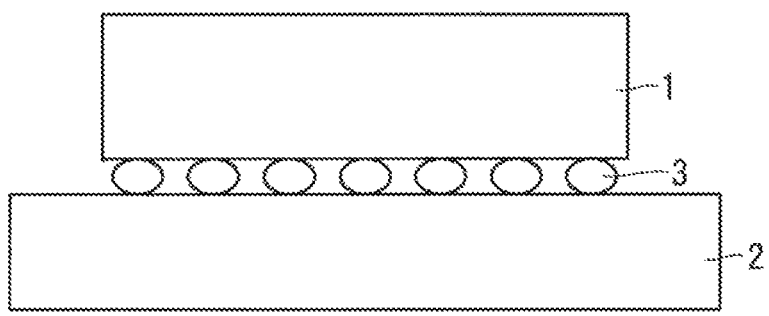
FIG. 3 is a cross-sectional view of the semiconductor device according to the first embodiment of the present invention, showing the method for manufacturing the semiconductor device.

First, as shown in FIG. 2, the solder 3, more specifically, a solder paste containing solder particles is applied to an electrode (not shown) on the circuit board 2, and the semiconductor package 1 is mounted on the circuit board 2. Then, the circuit board 2 on which the semiconductor package 1 has been mounted is put into a reflow furnace. Heating the solder paste to a melting point or above in the reflow furnace causes the semiconductor package 1 to be bonded to the circuit board 2 as shown in FIG. 3.

Figure 4:
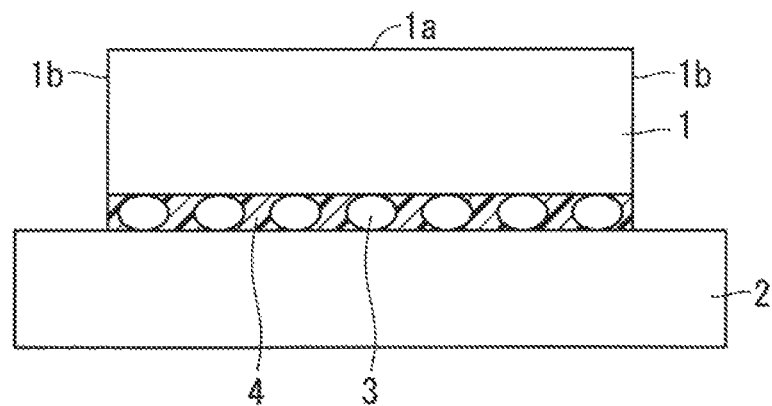
FIG. 4 is a cross-sectional view of the semiconductor device according to the first embodiment of the present invention, showing the method for manufacturing the semiconductor device.

Next, as shown in FIG. 4, the underfill resin 4 is injected into around the solder 3 and is then heated to be cured.

Figure 5:
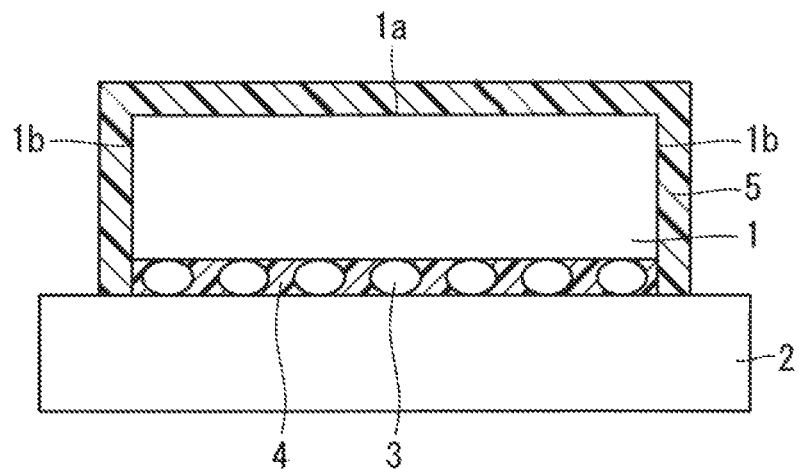
FIG. 5 is a cross-sectional view of the semiconductor device according to the first embodiment of the present invention, showing the method for manufacturing the semiconductor device.

Thereafter, as shown in FIG. 5, the electromagnetic wave absorbing layer 5 is formed on an upper surface 1a and side surfaces 1b of the semiconductor package 1. Here, the electromagnetic wave absorbing layer 5 is described as an epoxy resin containing ferrite particles. Specifically, a paste that results from mixing magnetic ferrite particles into a liquid epoxy resin is applied to a surface of the semiconductor package 1, and then the paste is heated to be cured, thereby forming the electromagnetic wave absorbing layer 5 covering the semiconductor package 1.

Note that examples of the method for applying the paste include printing, dispensing, electrostatic application, and the like. According to the printing, with a mask having an opening larger than the semiconductor package, filling the opening with the paste allows the paste to be applied to the upper surface and the side surfaces of the semiconductor package. According to the dispensing, dropping the paste onto the upper surface of the semiconductor package causes the paste to flow from the upper surface to the side surfaces, thereby allowing the paste to be applied to the upper surface and the side surfaces of the semiconductor package. According to the electrostatic application, as described in Japanese Patent Application Laid-Open No. 2014-157897, spraying the paste bearing electrical charges with a gun allows the paste to applied to the upper surface and the side surfaces of the semiconductor package 1 with a uniform thickness.

Figure 6:
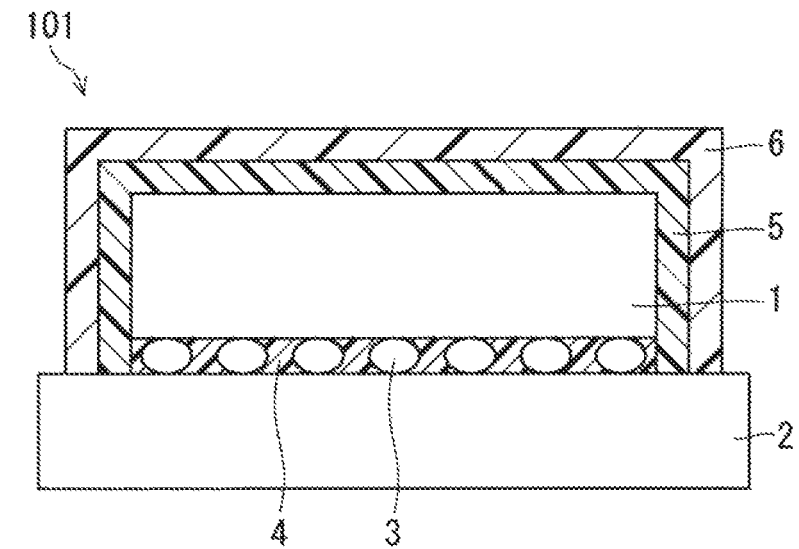
FIG. 6 is a cross-sectional view of the semiconductor device according to the first embodiment of the present invention, showing the method for manufacturing the semiconductor device.
Figure 33:
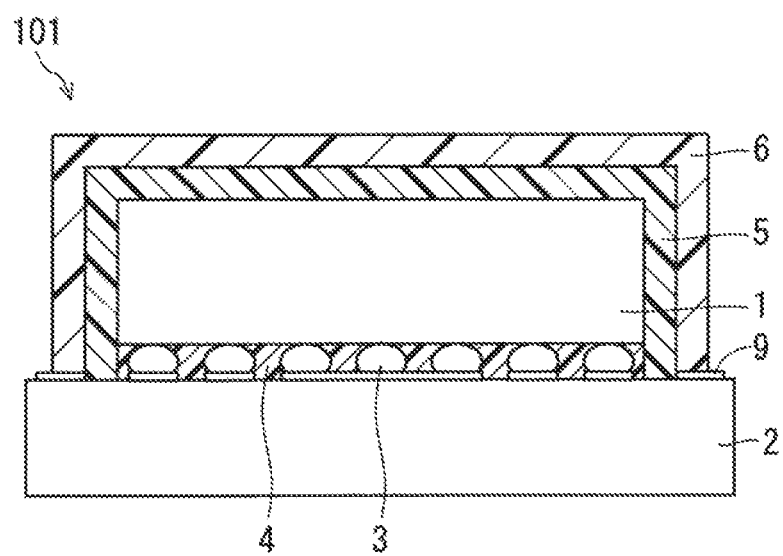
FIG. 33 is a cross-sectional view of the semiconductor device according to the first embodiment of the present invention.
Figure 34:
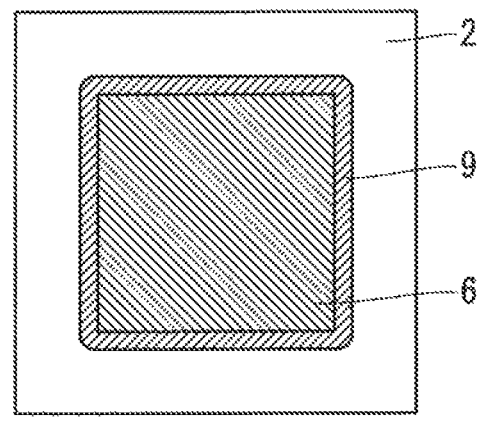
FIG. 34 is a top view of the semiconductor device according to the first embodiment of the present invention.

Next, as shown in FIG. 6, the electromagnetic wave reflecting layer 6 is formed on the electromagnetic wave absorbing layer 5. Here, the electromagnetic wave reflecting layer 6 is described as an epoxy resin containing copper particles as conductive particles. Specifically, a paste that results from mixing copper particles into a liquid epoxy resin is applied onto the electromagnetic wave absorbing layer 5 by printing, dispensing, electrostatic application, or the like, and then the paste is heated to be cured, thereby forming the electromagnetic wave reflecting layer 6 covering the electromagnetic wave absorbing layer 5. Note that, as shown in FIG. 33, the electromagnetic wave reflecting layer 6 is electrically connected to the ground electrode of a board pattern 9 on the circuit board 2. FIG. 34 is a top view of the semiconductor device 101. As shown in FIG. 34, the ground electrode is provided on an entire periphery of the semiconductor package.

Next, an electromagnetic wave shielding effect exhibited by the semiconductor device 101 will be described. The electromagnetic wave shielding effect is generally represented by Equation (1) called Schelkunoff's equation.

[Equation 1]

$$SE = R + A + B \quad (1)$$

Equation (1) shows that an electromagnetic wave shielding effect SE is represented by the sum of a reflection loss R, an absorption loss A, and a multiple reflection loss B. The reflection loss represents a loss caused when an incoming electromagnetic wave is reflected off a surface. The absorption loss represents a loss due to attenuation of a transmitted electromagnetic wave. The multiple reflection loss represents a loss due to repeated attenuation caused by reflections within a shielding material.

Figure 7:
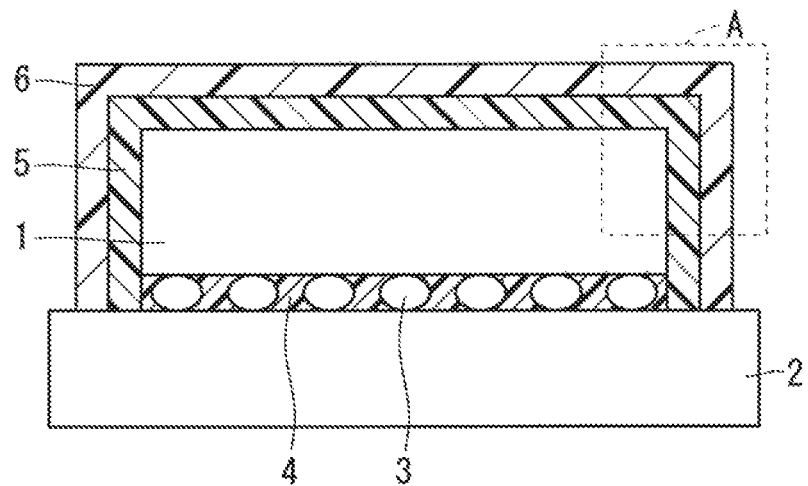
FIG. 7 is a cross-sectional view of the semiconductor device according to the first embodiment of the present invention.
Figure 8:
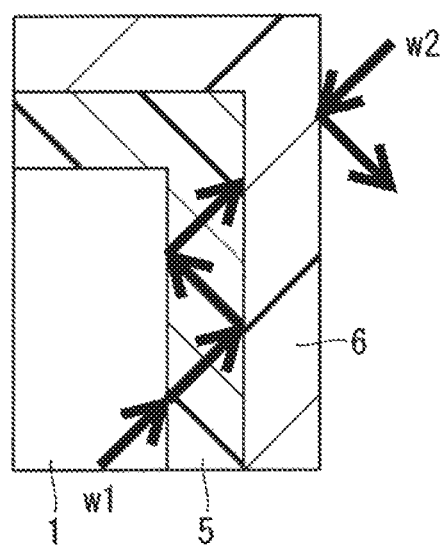
FIG. 8 is a partially enlarged view of the semiconductor device according to the first embodiment of the present invention.

FIG. 7 is a cross-sectional view of the semiconductor device 101, and FIG. 8 is a partially enlarged view of the semiconductor device 101 in which a region A shown in FIG. 7 is enlarged. As shown in FIG. 8, an electromagnetic wave W1 generated in the semiconductor package 1 is partially absorbed by the electromagnetic wave absorbing layer 5 (absorption loss). Although a part of the electromagnetic wave W1 does not get absorbed by the electromagnetic wave absorbing layer 5 but reaches the electromagnetic wave reflecting layer 6, the part of the electromagnetic wave W1 is reflected off the electromagnetic wave reflecting layer 6 and then impinges on the electromagnetic wave absorbing layer 5 again, which causes the part of the electromagnetic wave W1 to be absorbed by the electromagnetic wave absorbing layer 5. Further, the electromagnetic wave W1 that is reflected off the electromagnetic wave reflecting layer 6 and reaches the semiconductor package 1 without being absorbed by the electromagnetic wave absorbing layer 5 is reflected off the semiconductor package 1 and then impinges on the electromagnetic wave absorbing layer 5 again. As described above, the electromagnetic wave W1 is repeatedly reflected off the electromagnetic wave reflecting layer 6 and the semiconductor package 1 and is finally absorbed by the electromagnetic wave absorbing layer 5 (multiple reflection loss).

Further, the electromagnetic wave reflecting layer 6 reflects an electromagnetic wave W2 coming from the outside (reflection loss), which prevents the electromagnetic wave W2 from reaching the semiconductor package 1. Further, a structure where the circuit board 2 is a multilayer board having a single patterned layer of Cu can reduce leakage of the electromagnetic wave through a bottom surface of the semiconductor package 1.

As described above, drastically attenuating energy of the electromagnetic wave W1 generated by the semiconductor package 1 and cutting off the electromagnetic wave W2 coming from the outside can reduce influences of the electromagnetic waves on the semiconductor package 1.

Next, a heat dissipation effect exhibited by the semiconductor device 101 will be described. Heat generated by the semiconductor package 1 and heat generated by the absorption of the electromagnetic wave in the electromagnetic wave absorbing layer 5 are conducted to the circuit board 2 via the electromagnetic wave reflecting layer 6 and then dissipated from the circuit board 2. Note that since the electromagnetic wave reflecting layer 6 contains copper particles having a high thermal conductivity, the electromagnetic wave reflecting layer 6 is superior in thermal conductivity to the electromagnetic wave absorbing layer 5.

Next, an adhesion effect exhibited by the electromagnetic wave absorbing layer 5 and the electromagnetic wave reflecting layer 6 will be described. The electromagnetic wave absorbing layer 5 is made of resin such as an epoxy resin containing magnetic particles or carbon, and the electromagnetic wave reflecting layer 6 is made of resin such as an epoxy resin containing conductive particles. The adhesion between the electromagnetic wave absorbing layer 5 and the electromagnetic wave reflecting layer 6 depends on adhesiveness between the respective resins of which the electromagnetic wave absorbing layer 5 and the electromagnetic wave reflecting layer 6 are made. The adhesiveness between the resins is determined based on a difference in solubility parameter between the resins. The solubility parameter is defined as the square root of the cohesive energy density, and the closer the cohesive energy density between the resins is, the greater the adhesive strength becomes. Therefore, as the resin making up the electromagnetic wave absorbing layer 5, resin that is close in solubility parameter to the resin making up the electromagnetic wave reflecting layer 6, specifically, resin that is different in solubility parameter by 2 or less, or ideally equal in solubility parameter is used, which makes it possible to achieve high adhesiveness between the electromagnetic wave absorbing layer 5 and the electromagnetic wave reflecting layer 6.

Further, both of the electromagnetic wave absorbing layer 5 and the electromagnetic wave reflecting layer 6 is made of resin such as an epoxy resin. Such a resin allows water vapor to pass therethrough, thereby allowing the electromagnetic wave absorbing layer 5 and the electromagnetic wave reflecting layer 6 to release water vapor generated in the semiconductor package 1 to the outside. This can prevent the electromagnetic wave absorbing layer 5 from being separated off due to moisture accumulated between the semiconductor package 1 and the electromagnetic wave absorbing layer 5 and prevent the electromagnetic wave reflecting layer 6 from being separated off due to moisture accumulated between the electromagnetic wave absorbing layer 5 and the electromagnetic wave reflecting layer 6.

Next, the thickness of the electromagnetic wave absorbing layer 5 will be described. In a case where a frequency of the electromagnetic wave radiated from the semiconductor package 1 is known beforehand, determining the thickness of the electromagnetic wave absorbing layer 5 in accordance with the frequency can increase an effect of absorbing electromagnetic waves exhibited by the electromagnetic wave absorbing layer 5. When respective phases of an incident wave that impinges on the electromagnetic wave absorbing layer 5 from the semiconductor package 1 and a reflected wave that is reflected off the electromagnetic wave reflecting layer 6 and then impinges on the electromagnetic wave absorbing layer 5 are different from each other by 180°, energy that causes the incident wave and the reflected wave to negate each other is maximized. At this time, a relation between the thickness t (mm) of the electromagnetic wave absorbing layer 5 and the wavelength λ (mm) of the electromagnetic wave is represented by Equation (2).

[Equation 2]
$$t = \frac{\lambda}{4} \quad (2)$$

Further, a relation between the wavelength λ (mm) and the frequency f (Hz) is represented by Equation (3) where c is the speed of light (m/s).

[Equation 3]
$$\lambda = \frac{c}{f} \quad (3)$$

On the basis of Equations (2) and (3), the relation between the thickness t (mm) of the electromagnetic wave absorbing layer 5 and the frequency f (Hz) of the electromagnetic wave is represented by the following Equation (4).

[Equation 4]
$$t = \frac{c}{4f} \quad (4)$$

According to Equation (4), assuming that the frequency f of the electromagnetic wave radiated from the semiconductor package 1 is 25 GHz, a corresponding wavelength λ is 11.99 mm according to Equation (3), and the thickness t of the electromagnetic wave absorbing layer 5 is preferably 3.00 mm according to Equation (4). Therefore, determining the thickness of the electromagnetic wave absorbing layer 5 to be 3 mm makes it possible to maximize the energy that causes the incident wave and the reflected wave to negate each other and efficiently absorb the electromagnetic wave.

As described above, the semiconductor device 101 according to the first embodiment of the present invention includes the semiconductor package 1 bonded onto the circuit board 2, the electromagnetic wave absorbing layer 5 covering all surfaces of the semiconductor package 1 other than a surface bonded to the circuit board 2, the electromagnetic wave reflecting layer 6 covering the electromagnetic wave absorbing layer 5 on a side remote from the semiconductor package 1, in which the electromagnetic wave absorbing layer 5 is made of resin containing magnetic particles or carbon, and the electromagnetic wave reflecting layer 6 is made of resin containing conductive particles. This allows the electromagnetic wave absorbing layer 5 to absorb the electromagnetic wave radiated from the semiconductor package 1. Further, since the electromagnetic wave that reaches the electromagnetic wave reflecting layer 6 without being absorbed by the electromagnetic wave absorbing layer 5 is also reflected off the electromagnetic wave reflecting layer 6 and then impinges on the electromagnetic wave absorbing layer 5 again, the electromagnetic wave can be absorbed by the electromagnetic wave absorbing layer 5. Further, the electromagnetic wave that impinges on the semiconductor device 101 from the outside is reflected off the electromagnetic wave reflecting layer 6. The above effects can reduce an electromagnetic wave interference effect on the semiconductor package 1. Further, since the resin that allows water vapor to pass therethrough is used for the electromagnetic wave absorbing layer 5 and the electromagnetic wave reflecting layer 6, separation of the electromagnetic wave absorbing layer 5 or the electromagnetic wave reflecting layer 6 can be prevented. Further, since the electromagnetic wave reflecting layer 6 contains conductive particles and thus has a high thermal conductivity, heat generated by the semiconductor package 1 can be conducted from the electromagnetic wave reflecting layer 6 to the circuit board 2 and dissipated from the circuit board 2.

B. Second Embodiment

Figure 9:
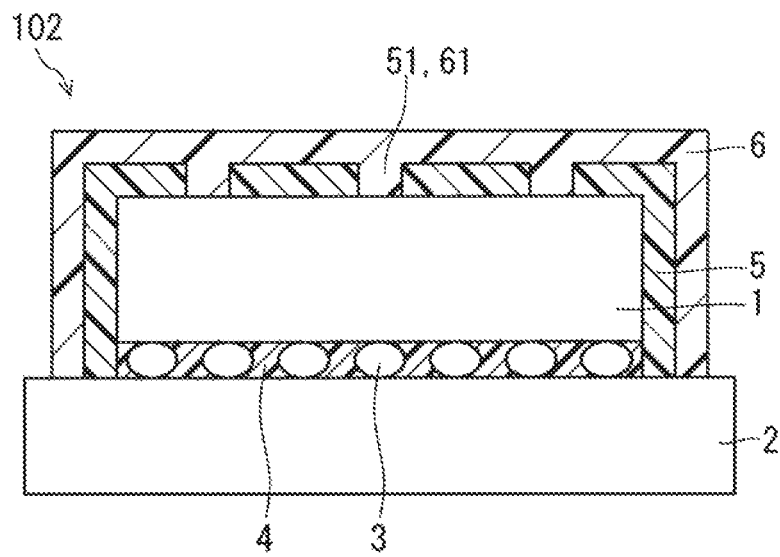
FIG. 9 is a cross-sectional view of a structure of a semiconductor device according to a second embodiment of the present invention.

FIG. 9 is a cross-sectional view of a semiconductor device 102 according to a second embodiment of the present invention. The semiconductor device 102 differs from the semiconductor device 101 according to the first embodiment in that the electromagnetic wave absorbing layer 5 has an opening 51 on the upper surface of the semiconductor package 1, and a heat dissipating via 61 is formed in the opening 51. The heat dissipating via 61 is in contact with the electromagnetic wave reflecting layer 6 and the semiconductor package 1. Therefore, the electromagnetic wave reflecting layer 6 is in contact with the semiconductor package 1 via the heat dissipating via 61 in the opening 51 of the electromagnetic wave absorbing layer 5. Note that the opening 51 has a diameter of 0.1 mm, for example.

FIG. 10, FIG. 11, FIG. 12, and FIG. 13 are each a cross-sectional view of the semiconductor device 102, showing a first method for manufacturing the semiconductor device 102. Hereinafter, the first method for manufacturing the semiconductor device 102 will be described with reference to these drawings.

Figure 10:
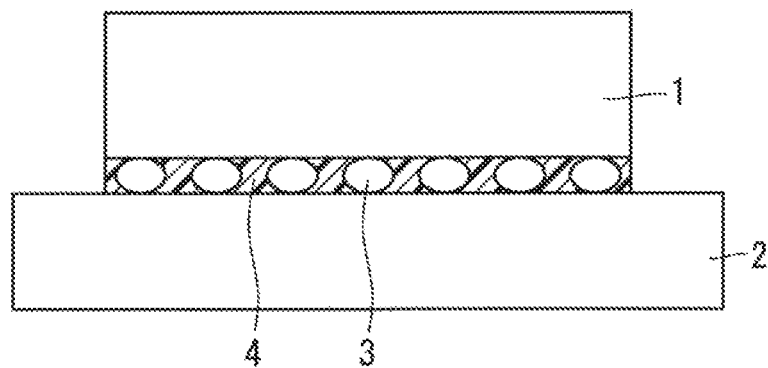
FIG. 10 is a cross-sectional view of the semiconductor device according to the second embodiment of the present invention, showing a first method for manufacturing the semiconductor device.

FIG. 10 is a cross-sectional view showing a state where the semiconductor package 1 is bonded onto the circuit board 2 with the solder 3 and the underfill resin 4 fills a space around the solder 3, and FIG. 10 is the same as FIG. 4. In other words, a manufacturing process up to the structure shown in FIG. 10 is the same as the manufacturing process of the semiconductor device 101 according to the first embodiment shown in FIGS. 2, 3, and 4.

Figure 11:
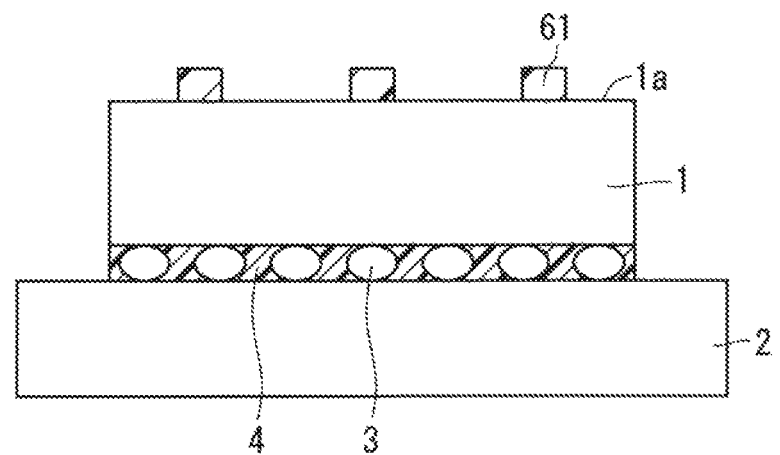
FIG. 11 is a cross-sectional view of the semiconductor device according to the second embodiment of the present invention, showing the first method for manufacturing the semiconductor device.
Figure 35:
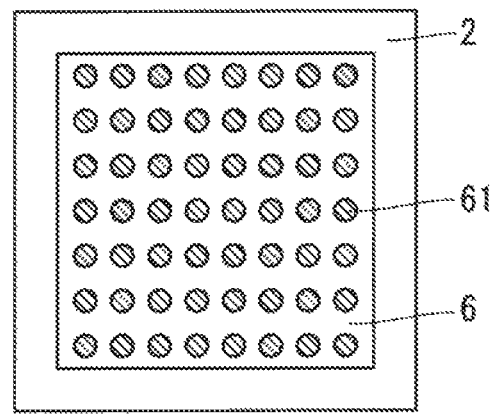
FIG. 35 is a top view of the semiconductor device according to the second embodiment of the present invention.
Figure 36:
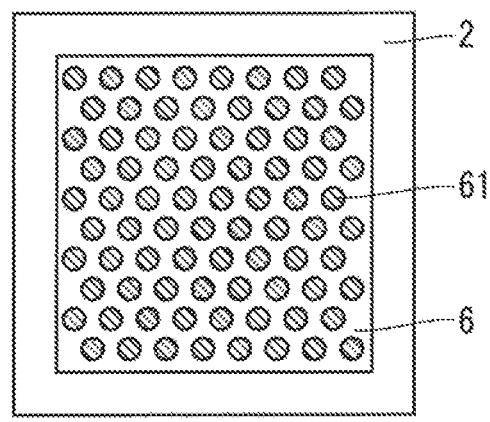
FIG. 36 is a top view of the semiconductor device according to the second embodiment of the present invention.

Next, as shown in FIG. 11, a plurality of protrusions that are each prepared for the heat dissipating via 61 are formed on the upper surface 1a of the semiconductor package 1. Here, a plurality of the heat dissipating vias 61 are formed, but at least one heat dissipating via 61 only needs to be formed. The same material as that of the electromagnetic wave reflecting layer 6, that is, the paste that results from mixing conductive particles into a liquid epoxy resin, is printed on the upper surface 1a of the semiconductor package 1 to form the heat dissipating via 61. Note that, instead of the printing, ink jetting, dispensing, or electrostatic application may be used. Further, as shown in FIG. 35 and FIG. 36, it is preferable that the heat dissipating vias 61 be arranged in a lattice pattern. FIG. 35 and FIG. 36 are each a top view of the semiconductor device 102.

Figure 12:
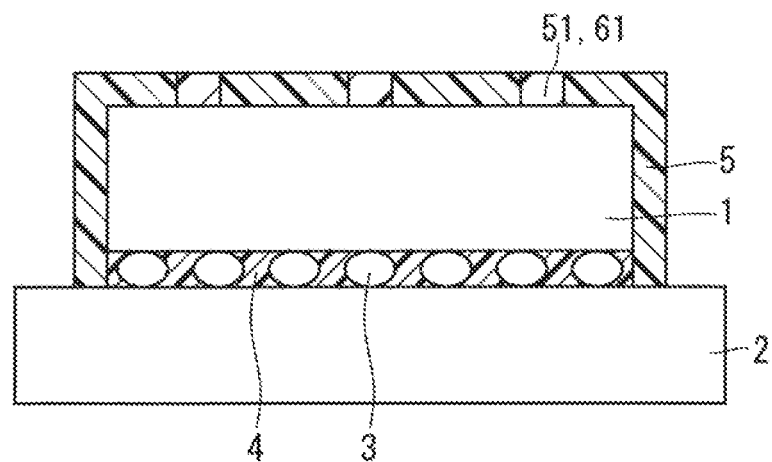
FIG. 12 is a cross-sectional view of the semiconductor device according to the second embodiment of the present invention, showing the first method for manufacturing the semiconductor device.

Thereafter, as shown in FIG. 12, the electromagnetic wave absorbing layer 5 is formed on the upper surface 1a and the side surfaces 1b of the semiconductor package 1. The method for forming the electromagnetic wave absorbing layer 5 is as described above. Since the heat dissipating via 61 has been locally formed on the upper surface 1a of the semiconductor package 1, in a region where the heat dissipating via 61 has been formed, the electromagnetic wave absorbing layer 5 is once formed on the heat dissipating via 61, but the upper surface of the electromagnetic wave absorbing layer 5 is ground to expose the heat dissipating via 61. This prevents the electromagnetic wave absorbing layer 5 from being formed in the region where the heat dissipating via 61 is formed; in other words, this forms the opening 51 of the electromagnetic wave absorbing layer 5.

Figure 13:
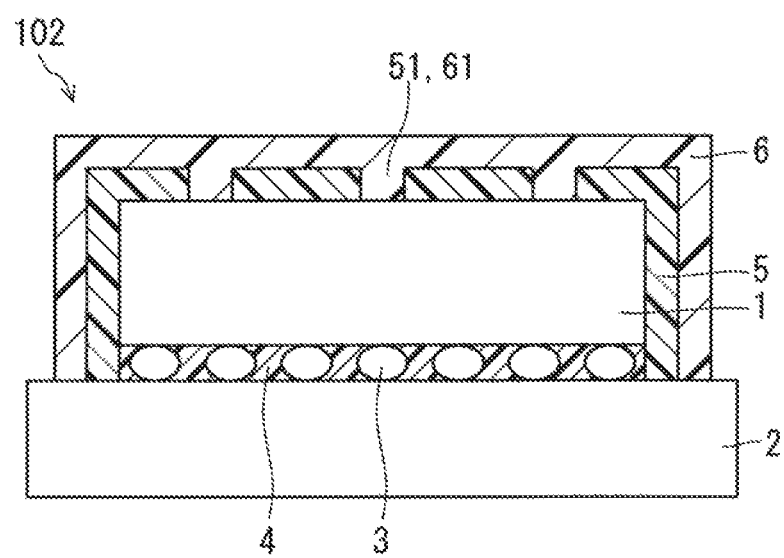
FIG. 13 is a cross-sectional view of the semiconductor device according to the second embodiment of the present invention, showing the first method for manufacturing the semiconductor device.

Next, the electromagnetic wave reflecting layer 6 is formed covering the electromagnetic wave absorbing layer 5. The method for forming the electromagnetic wave reflecting layer 6 is as described above. Consequently, the semiconductor device 102 shown in FIG. 13 is completed. Note that FIG. 13 is the same as FIG. 9. The electromagnetic wave reflecting layer 6 covers the upper surface 1a and the side surfaces 1b of the semiconductor package 1 via the electromagnetic wave absorbing layer 5, but, in the opening 51 of the electromagnetic wave absorbing layer 5, the electromagnetic wave reflecting layer 6 is in contact with the upper surface 1a of the semiconductor package 1 via the heat dissipating via 61. Further, the electromagnetic wave reflecting layer 6 is electrically connected to the ground electrode on the circuit board 2.

Figure 14:
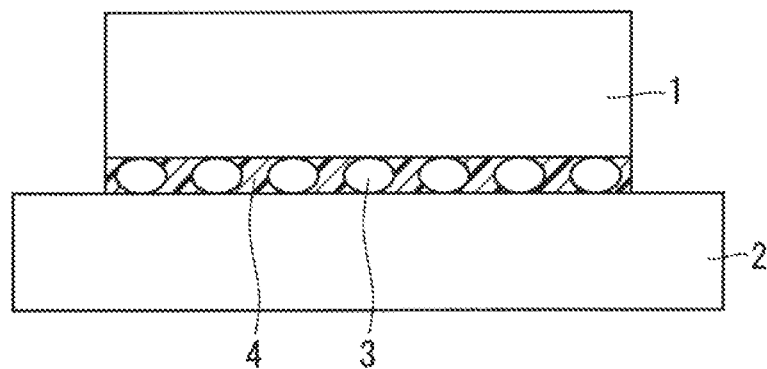
FIG. 14 is a cross-sectional view of the semiconductor device according to the second embodiment of the present invention, showing a second method for manufacturing the semiconductor device.

FIG. 14, FIG. 15, FIG. 16, and FIG. 17 are each a cross-sectional view of the semiconductor device 102, showing a second method for manufacturing the semiconductor device 102. Hereinafter, the second method for manufacturing the semiconductor device 102 will be described with reference to these drawings. FIG. 14 is a cross-sectional view showing a state where the semiconductor package 1 is bonded onto the circuit board 2 with the solder 3 and the underfill resin 4 fills a space around the solder 3, and FIG. 14 is the same as FIG. 4 and FIG. 10. In other words, a manufacturing process up to the structure shown in FIG. 14 in accordance with the second method for manufacturing the semiconductor device 102 is the same as the manufacturing process of the semiconductor device 101 according to the first embodiment shown in FIGS. 2, 3, and 4.

Figure 15:
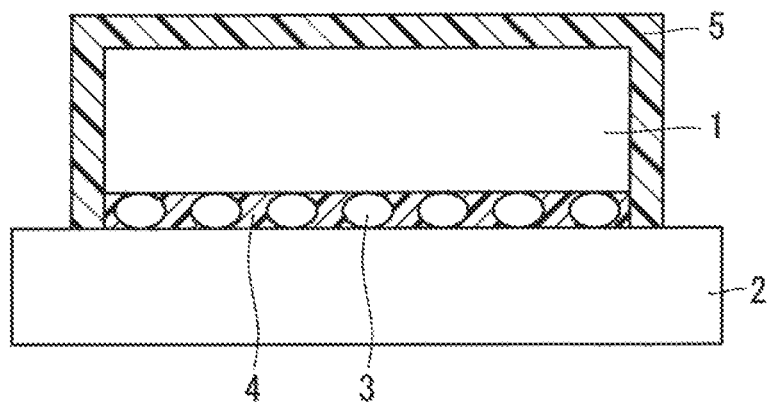
FIG. 15 is a cross-sectional view of the semiconductor device according to the second embodiment of the present invention, showing the second method for manufacturing the semiconductor device.

Next, as shown in FIG. 15, the electromagnetic wave absorbing layer 5 covering the upper surface 1a and the side surfaces 1b of the semiconductor package 1 is formed. The method for forming the electromagnetic wave absorbing layer 5 is as described above.

Figure 16:
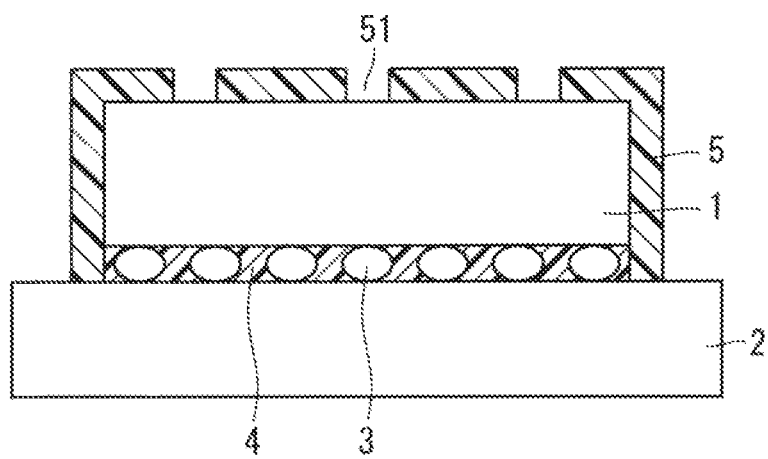
FIG. 16 is a cross-sectional view of the semiconductor device according to the second embodiment of the present invention, showing the second method for manufacturing the semiconductor device.

Thereafter, as shown in FIG. 16, a plurality of the openings 51 are formed with a laser through the electromagnetic wave absorbing layer 5 that faces the upper surface 1a of the semiconductor package 1. Here, the plurality of openings 51 are formed, but at least one opening 51 only needs to be formed. Here, the upper surface 1a of the semiconductor package 1 is exposed through the opening 51.

Figure 17:
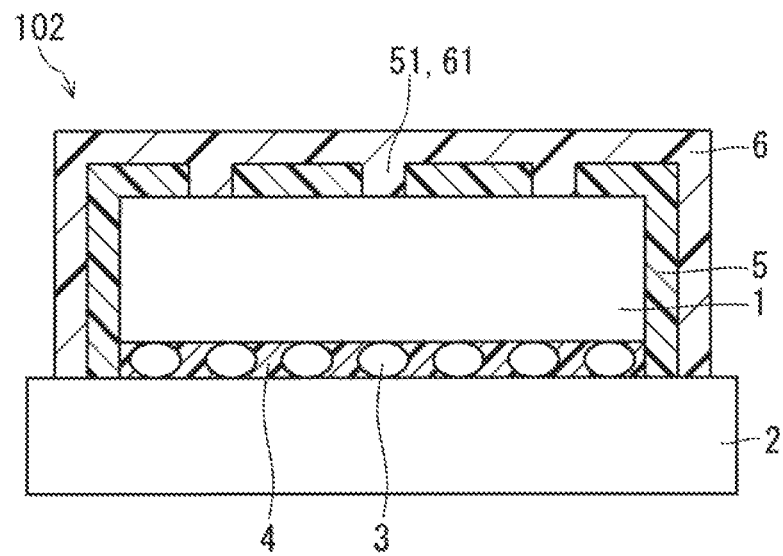
FIG. 17 is a cross-sectional view of the semiconductor device according to the second embodiment of the present invention, showing the second method for manufacturing the semiconductor device.

Next, the heat dissipating via 61 is formed inside the opening 51 of the electromagnetic wave absorbing layer 5, and the electromagnetic wave reflecting layer 6 is formed covering the electromagnetic wave absorbing layer 5. The method for forming the heat dissipating via 61 and the electromagnetic wave reflecting layer 6 is as described above. The electromagnetic wave reflecting layer 6 covers the upper surface 1a and the side surfaces 1b of the semiconductor package 1 via the electromagnetic wave absorbing layer 5, but, in the opening 51 of the electromagnetic wave absorbing layer 5, the electromagnetic wave reflecting layer 6 is in contact with the upper surface 1a of the semiconductor package 1 via the heat dissipating via 61. Further, the electromagnetic wave reflecting layer 6 electrically connects to the ground electrode on the circuit board 2. Consequently, the semiconductor device 102 shown in FIG. 17 is completed. Note that FIG. 17 is the same as FIG. 9 and FIG. 13.

Next, an effect exhibited by the heat dissipating via 61 will be described. The electromagnetic wave reflecting layer 6 is in contact with the upper surface 1a of the semiconductor package 1 via the heat dissipating via 61 in the opening 51 of the electromagnetic wave absorbing layer 5. The heat dissipating via 61 is made of resin containing conductive particles and has a thermal conductivity of about 5 to 10 W/(m·K) like the electromagnetic wave reflecting layer 6, which causes the heat dissipating via 61 to exhibit high heat dissipation compared with the electromagnetic wave absorbing layer 5 having a thermal conductivity of about 0.1 to 1.0 W/(m·K). This allows the heat generated by the semiconductor package 1 to be efficiently conducted to the electromagnetic wave reflecting layer 6 via the heat dissipating via 61. Consequently, a semiconductor device with excellent heat dissipation is obtained.

Further, since the heat dissipating via 61 is made of the same material as that of the electromagnetic wave reflecting layer 6, taking the heat dissipating via 61 as a part of the electromagnetic wave reflecting layer 6 increases a contact area between the electromagnetic wave absorbing layer 5 and the electromagnetic wave reflecting layer 6, which accordingly increases the adhesion strength. Further, the structure where the heat dissipating via 61 is formed through the opening 51 of the electromagnetic wave absorbing layer 5 exhibits an anchor effect, which increases the adhesion strength between the electromagnetic wave reflecting layer 6 and the electromagnetic wave absorbing layer 5 through mechanical coupling.

Any electromagnetic wave cannot pass through the opening 51 having a diameter smaller than the wavelength of the electromagnetic wave. For example, when the diameter of the opening 51 is 0.1 mm, an electromagnetic wave with a frequency of 3 THz or less cannot pass through the opening 51, and when the diameter of the opening 51 is 0.5 mm, an electromagnetic wave with a frequency of 600 GHz or less cannot pass through the opening 51. Therefore, determining the size of the opening 51 as described above prevents, even when the heat dissipating via 61 is provided, an electromagnetic wave shielding capability from deteriorating. Further, the heat dissipating via 61 is filled with an electromagnetic wave reflecting material and thus reflects the electromagnetic wave. Therefore, even when the size of the opening 51 is larger than the wavelength of the electromagnetic wave, the electromagnetic wave cannot pass through the opening 51.

As described above, in the semiconductor device 102 according to the second embodiment, the electromagnetic wave absorbing layer 5 includes the opening 51, and the heat dissipating via 61 made of resin containing conductive particles is provided in the opening 51. This allows heat generated by the semiconductor package 1 to be efficiently conducted to the electromagnetic wave reflecting layer 6 via the heat dissipating via 61 having a high thermal conductivity.

C. Third Embodiment

Figure 18:
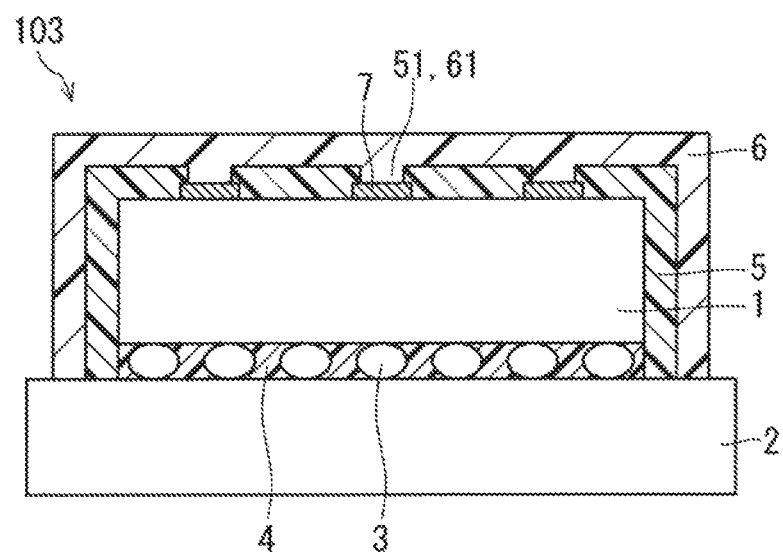
FIG. 18 is a cross-sectional view of a semiconductor device according to a third embodiment of the present invention.

FIG. 18 is a cross-sectional view of a semiconductor device 103 according to a third embodiment of the present invention. The semiconductor device 103 differs from the semiconductor device 102 according to the second embodiment in that a metal film 7 is formed in the opening 51 of the electromagnetic wave absorbing layer 5, but is identical in other configurations to the semiconductor device 102.

The metal film 7 is in contact with the upper surface 1a of the semiconductor package 1 in the opening 51 of the electromagnetic wave absorbing layer 5. Further, the metal film 7 is less in thickness than the electromagnetic wave absorbing layer 5, and the heat dissipating via 61 is formed on the metal film 7 in the opening 51.

The metal film 7 is provided to increase heat transfer performance of a path extending from the semiconductor package 1 to the electromagnetic wave reflecting layer 6 via the heat dissipating via 61. The metal film 7 is made of metal having a high thermal conductivity such as gold, silver, copper, or aluminum, for example. Alternatively, in order to increase adhesion between the metal film 7 and the semiconductor package 1, a two-layer structure may be employed where titanium or molybdenum is provided at an interface with the semiconductor package 1 in addition to the above-described metal having a high thermal conductivity.

The reason why the metal film 7 increases the heat transfer performance will be described below. The heat transfer performance based on thermal conduction is generally evaluated using "thermal resistance". "Thermal resistance" is an index representing a degree of resistance to temperature transfer, and corresponds to a value indicating an increase in temperature per unit amount of heat generation.

The thermal resistance of the heat dissipating via 61 is represented by the sum of "thermal resistance in the heat dissipating via 61" and "thermal contact resistance" between the heat dissipating via 61 and the semiconductor package 1. "Thermal resistance in the heat dissipating via 61" is determined based on the properties of the epoxy resin containing the conductive particles that makes up the heat dissipating via 61. Further, thermal contact resistance RC is represented by the following Equation (5).

[Equation 5]

$$\frac{1}{Rc} = \frac{1}{\frac{\delta_1}{\lambda_1} + \frac{\delta_2}{\lambda_2}} \left(\frac{a}{A}\right) + \frac{\lambda_f(A-a)}{A(\delta_1+\delta_2)} \qquad (5)$$

In Equation (5), a represents the sum of contact areas of real contact points, A represents an apparent area of a contact surface, δ represents an average roughness height, λ represents a thermal conductivity, and subscripts 1, 2 each represent an individual contact solid, a subscript f represents a substance interposed between contact surfaces.

According to Equation (5), the thermal contact resistance RC depends on the thermal conduction of a material with which contact is made, and it is understood that the thermal contact resistance becomes small if a material having a high thermal conductivity is interposed between the contact surfaces.

Therefore, in the semiconductor device 103, the metal film 7 is interposed between the heat dissipating via 61 and the upper surface 1a of the semiconductor package 1. The metal film 7 is made of metal having a high thermal conductivity such as gold, silver, copper, or aluminum, for example. For example, in a case where the metal film 7 is made of copper, the thermal conductivity is as high as 400 W/(m·K), which makes it possible to reduce the thermal contact resistance between the heat dissipating via 61 and the semiconductor package 1 and thus increase the heat transfer performance.

As described above, the semiconductor device 103 according to the third embodiment of the present invention includes, in addition to the configuration of the semiconductor device 102 according to the second embodiment, the metal film 7 disposed between the semiconductor package 1 and the heat dissipating via 61 in the opening 51 of the electromagnetic wave absorbing layer 5. This makes it possible to reduce the thermal contact resistance between the heat dissipating via 61 and the semiconductor package 1 and thus increase the heat transfer performance.

D. Fourth Embodiment

Figure 19:
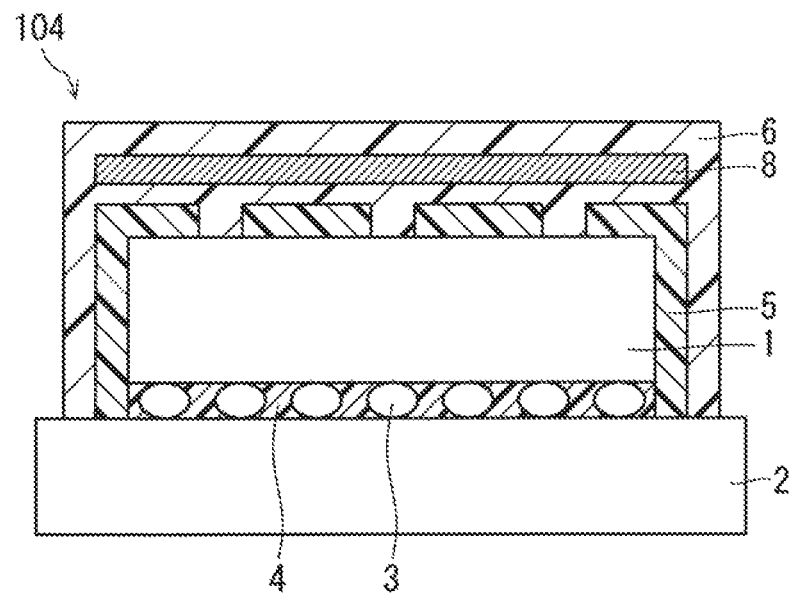
FIG. 19 is a cross-sectional view of a semiconductor device according to a fourth embodiment of the present invention.

FIG. 19 is a cross-sectional view of a semiconductor device 104 according to a fourth embodiment of the present invention. The semiconductor device 104 includes a metal plate 8 between a surface of the electromagnetic wave absorbing layer 5 having the opening 51 and the electromagnetic wave reflecting layer 6. In other words, the electromagnetic wave reflecting layer 6 covers the electromagnetic wave absorbing layer 5 via the metal plate 8 above the semiconductor package 1, and covers the electromagnetic wave absorbing layer 5 on the sides of the semiconductor package 1 in contact with the electromagnetic wave absorbing layer 5. The configuration of the semiconductor device 104 other than the above is the same as the configuration of the semiconductor device 102 according to the second embodiment. The metal plate 8 is made of metal having a high thermal conductivity such as gold, silver, copper, or aluminum.

FIG. 20, FIG. 21, FIG. 22, and FIG. 23 are each a diagram showing a first method for manufacturing the semiconductor device 104. Hereinafter, the first method for manufacturing the semiconductor device 104 will be described with reference to these drawings.

Figure 20:
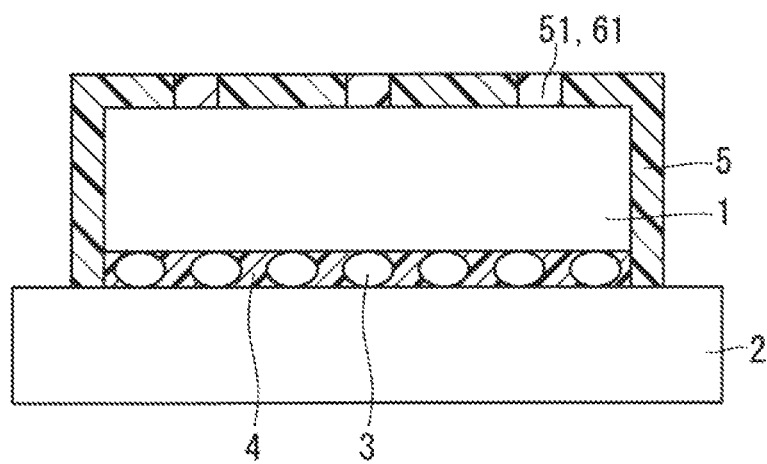
FIG. 20 is a cross-sectional view of the semiconductor device according to the fourth embodiment of the present invention, showing a first method for manufacturing the semiconductor device.

FIG. 20 shows a state where the heat dissipating via 61 is formed on the upper surface 1a of the semiconductor package 1, and the upper surface 1a and the side surfaces 1b of the semiconductor package 1 are covered with the electromagnetic wave absorbing layer 5. FIG. 20 is the same as FIG. 12. In other words, a manufacturing process up to the structure shown in FIG. 20 in accordance with the first method for manufacturing the semiconductor device 104 is the same as the manufacturing process in accordance with the first method for manufacturing the semiconductor device 102 according to the second embodiment.

Figure 21:
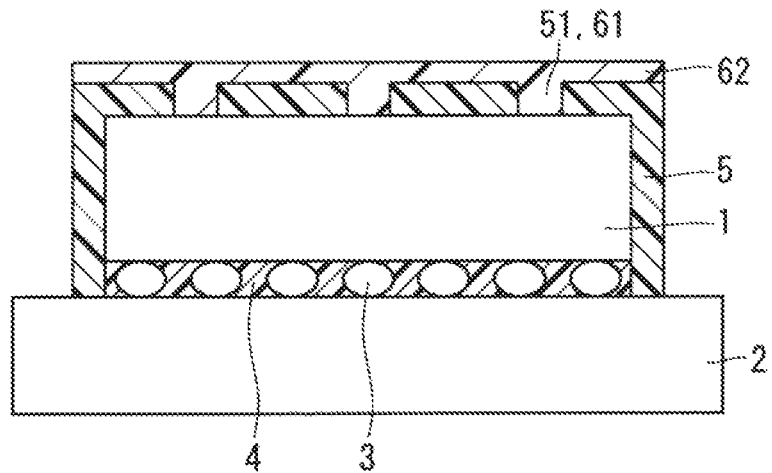
FIG. 21 is a cross-sectional view of the semiconductor device according to the fourth embodiment of the present invention, showing the first method for manufacturing the semiconductor device.
Figure 22:
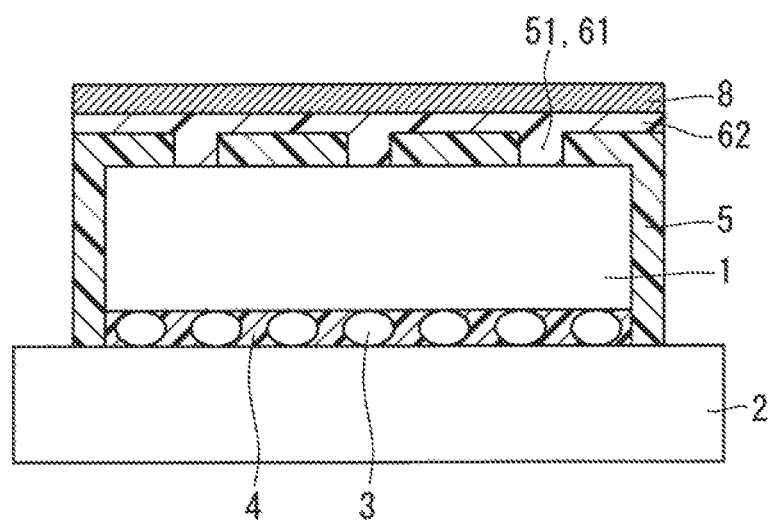
FIG. 22 is a cross-sectional view of the semiconductor device according to the fourth embodiment of the present invention, showing the first method for manufacturing the semiconductor device.

Next, as shown in FIG. 21, a paste 62 that results from mixing copper particles as conductive particles into the same material as that of the electromagnetic wave reflecting layer 6, that is, a liquid epoxy resin, is applied to the electromagnetic wave absorbing layer 5 and the heat dissipating via 61 via printing, ink jetting, dispensing, or electrostatic application. Then, the metal plate 8 is placed on the paste 62, and the paste 62 is heated to be cured, thereby fixing the metal plate 8 onto the electromagnetic wave absorbing layer 5 as shown in FIG. 22.

Figure 23:
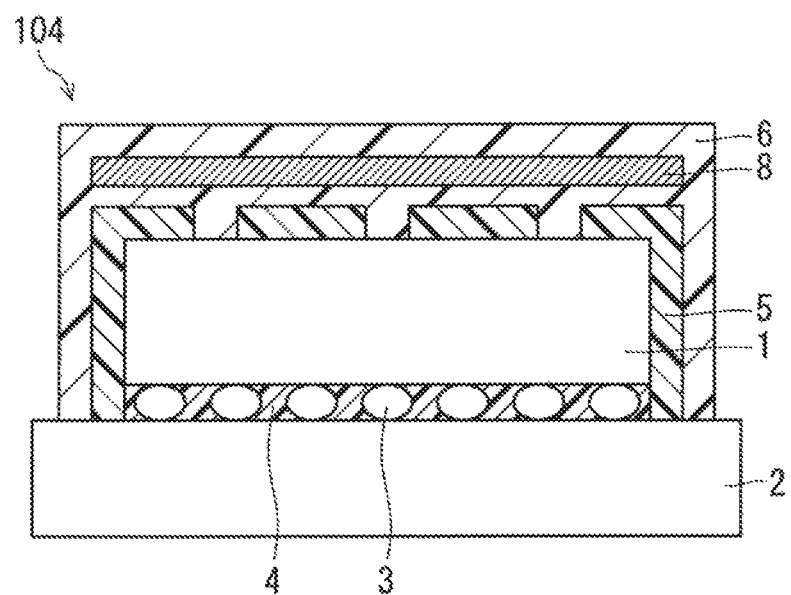
FIG. 23 is a cross-sectional view of the semiconductor device according to the fourth embodiment of the present invention, showing the first method for manufacturing the semiconductor device.

Thereafter, the electromagnetic wave reflecting layer 6 covering the metal plate 8 and the electromagnetic wave absorbing layer 5 is formed, and consequently, the semiconductor device 104 shown in FIG. 23 is completed.

FIG. 24, FIG. 25, FIG. 26, and FIG. 27 are each a cross-sectional view of the semiconductor device 104, showing a second method for manufacturing the semiconductor device 104. Hereinafter, the second method for manufacturing the semiconductor device 104 will be described with reference to these drawings.

Figure 24:
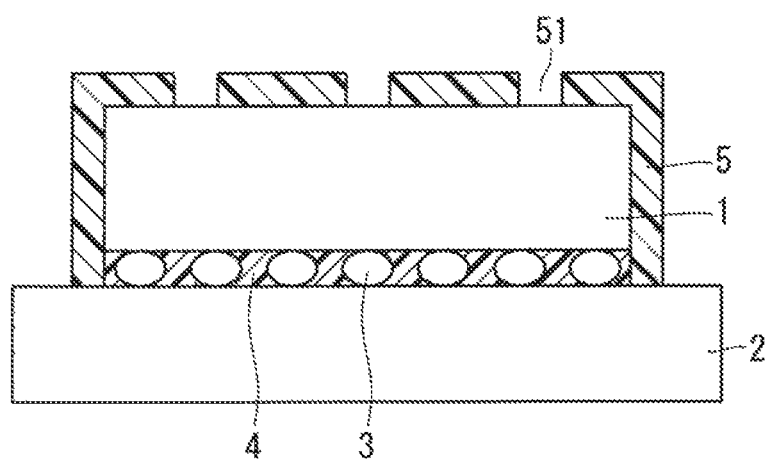
FIG. 24 is a cross-sectional view of the semiconductor device according to the fourth embodiment of the present invention, showing a second method for manufacturing the semiconductor device.

FIG. 24 shows a state where the upper surface 1a and the side surfaces 1b of the semiconductor package 1 are covered with the electromagnetic wave absorbing layer 5, and the opening 51 is formed through the electromagnetic wave absorbing layer 5 facing the upper surface 1a of the semiconductor package 1. Note that FIG. 24 is the same as FIG. 16. In other words, a manufacturing process up to the structure shown in FIG. 24 in accordance with the second method for manufacturing the semiconductor device 104 is the same as the manufacturing process in accordance with the second method for manufacturing the semiconductor device 102 according to the second embodiment.

Next, as shown in FIG. 25, the paste 62 that results from mixing copper particles as conductive particles into the same material as that of the electromagnetic wave reflecting layer 6, that is, a liquid epoxy resin, is applied into the opening 51 by printing to fill the opening 51, and is then thinly applied to the electromagnetic wave absorbing layer 5 by printing, ink jetting, dispensing, or electrostatic application. Here, the paste 62 in the opening 51 becomes the heat dissipating via 61. Then, the metal plate 8 is placed on the paste 62, and the paste 62 is heated to be cured, thereby fixing the metal plate 8 onto the electromagnetic wave absorbing layer 5 as shown in FIG. 26.

Figure 27:
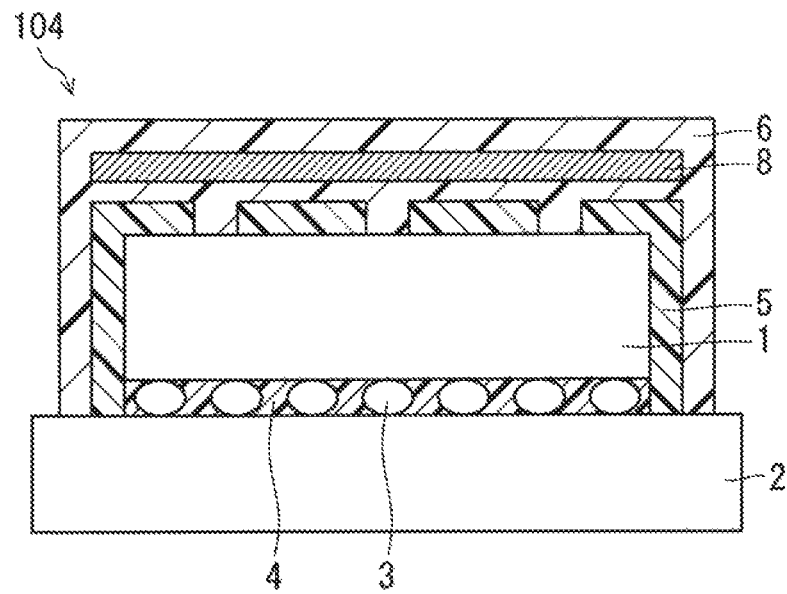
FIG. 27 is a cross-sectional view of the semiconductor device according to the fourth embodiment of the present invention, showing the second method for manufacturing the semiconductor device.

Thereafter, the electromagnetic wave reflecting layer 6 covering the metal plate 8 and the electromagnetic wave absorbing layer 5 is formed, and consequently, the semiconductor device 104 shown in FIG. 27 is completed.

In the semiconductor device 104, the metal plate 8 is provided between the electromagnetic wave absorbing layer 5 and the electromagnetic wave reflecting layer 6. Since the resin making up the electromagnetic wave reflecting layer 6 is in contact with metal rather than the resin making up the electromagnetic wave absorbing layer 5, a high adhesion strength is achieved between the electromagnetic wave reflecting layer 6 and the metal plate 8, which makes it possible to prevent the electromagnetic wave reflecting layer 6 from being separated off. Further, the metal plate 8 serves as a heat spreader for dissipating heat of the electromagnetic wave absorbing layer 5, which prevents the heat generated by the semiconductor package 1 from staying in the electromagnetic wave absorbing layer 5 and thus increases the heat dissipation.

Note that the electromagnetic wave reflecting layer 6 covers the metal plate 8 and the side surfaces 1b of the semiconductor package 1 and is connected to the ground electrode of the circuit board 2. In other words, the metal plate 8 is connected to the ground electrode of the circuit board 2 via the electromagnetic wave reflecting layer 6.

As described above, the semiconductor device 104 according to the fourth embodiment of the present invention includes, in addition to the configuration of the semiconductor device 102 according to the second embodiment, the metal plate 8 disposed between the surface having the opening 51 of the electromagnetic wave absorbing layer 5 and the electromagnetic wave reflecting layer 6. Therefore, since the resin making up the electromagnetic wave reflecting layer 6 is in contact with metal rather than the resin making up the electromagnetic wave absorbing layer 5, a high adhesion strength is achieved between the electromagnetic wave reflecting layer 6 and the metal plate 8, which makes it possible to prevent the electromagnetic wave reflecting layer 6 from being separated off.

E. Fifth Embodiment

Figure 28:
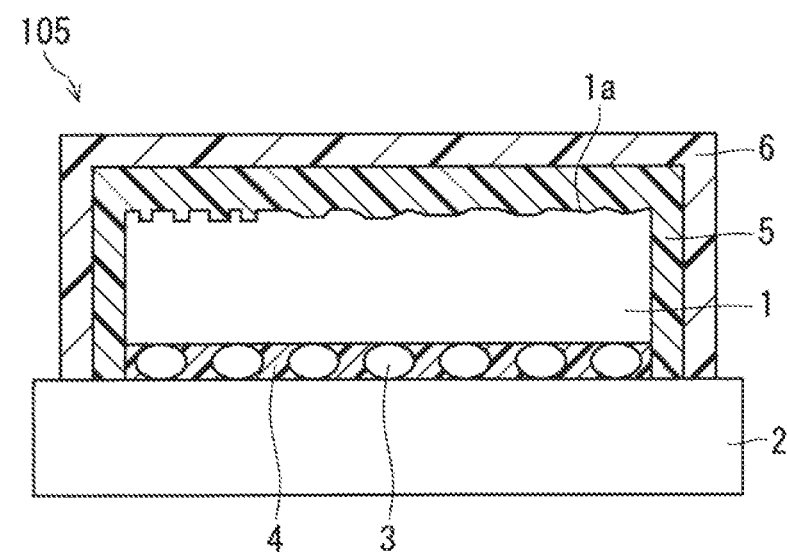
FIG. 28 is a cross-sectional view of a semiconductor device according to a fifth embodiment of the present invention.

FIG. 28 is a cross-sectional view of a semiconductor device 105 according to a fifth embodiment. The semiconductor device 105 differs from the semiconductor device 101 according to the first embodiment in that the upper surface 1a of the semiconductor package 1 has an uneven shape, but is otherwise identical to the semiconductor device 101.

FIG. 29, FIG. 30, FIG. 31, and FIG. 32 are each a cross-sectional view of the semiconductor device 105, showing a method for manufacturing the semiconductor device 105. Hereinafter, the method for manufacturing the semiconductor device 105 will be described with reference to these drawings.

Figure 29:
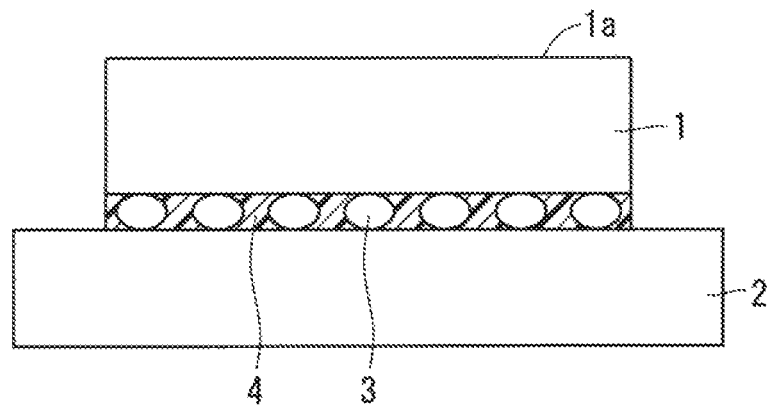
FIG. 29 is a cross-sectional view of the semiconductor device according to the fifth embodiment of the present invention, showing a method for manufacturing the semiconductor device.

FIG. 29 is a cross-sectional view showing a state where the semiconductor package 1 is bonded onto the circuit board 2 with the solder 3 and the underfill resin 4 fills a space around the solder 3, and FIG. 29 is the same as FIG. 4. In other words, a manufacturing process up to the structure shown in FIG. 10 is the same as the manufacturing process of the semiconductor device 101 according to the first embodiment shown in FIGS. 2, 3, and 4.

Figure 30:
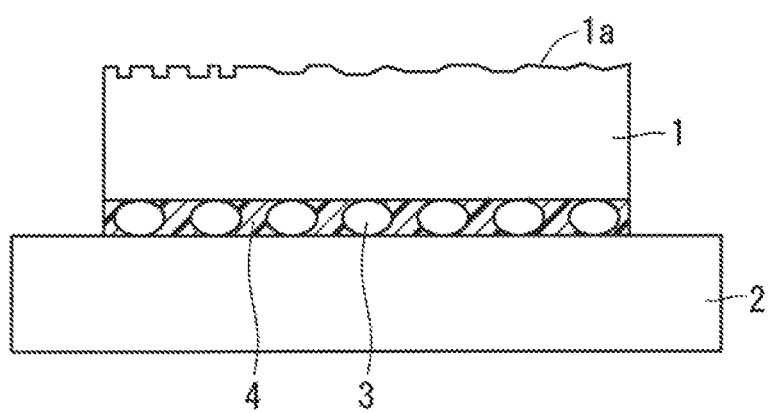
FIG. 30 is a cross-sectional view of the semiconductor device according to the fifth embodiment of the present invention, showing the method for manufacturing the semiconductor device.
Figure 31:
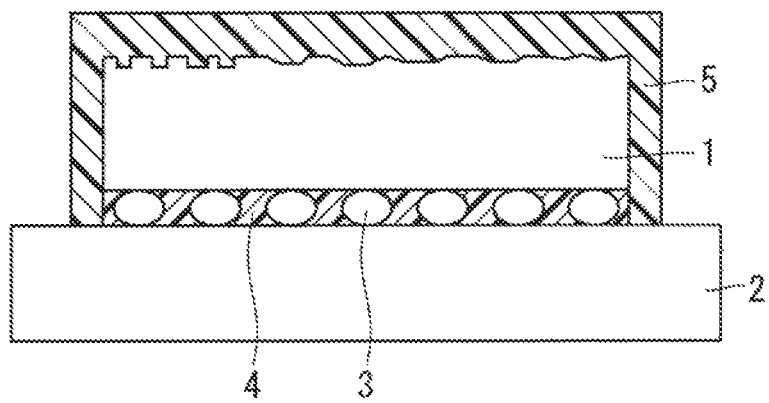
FIG. 31 is a cross-sectional view of the semiconductor device according to the fifth embodiment of the present invention, showing the method for manufacturing the semiconductor device.
Figure 32:
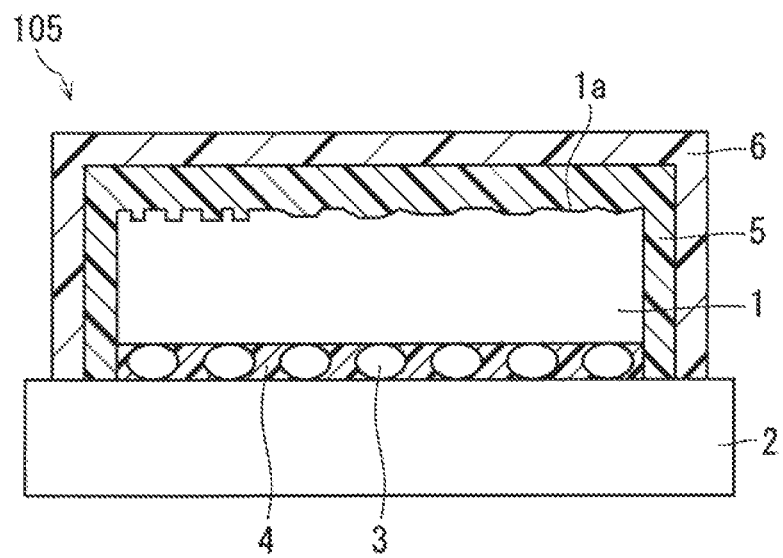
FIG. 32 is a cross-sectional view of the semiconductor device according to the fifth embodiment of the present invention, showing the method for manufacturing the semiconductor device.

Next, as shown in FIG. 30, the upper surface 1a of the semiconductor package 1 is irradiated with a laser to form irregularities. Alternatively, a mold used for molding the underfill resin 4 is provided with irregularities, and with the mold, irregularities are formed on the upper surface 1a of the semiconductor package 1. The same effect is achieved by either the laser machining or the mold machining in regard to the formation of irregularities on the upper surface 1a of the semiconductor package 1. Thereafter, as in the first embodiment, the upper surface 1a and the side surfaces 1b of the semiconductor package are covered with the electromagnetic wave absorbing layer 5 (FIG. 31), the electromagnetic wave absorbing layer 5 is covered with the electromagnetic wave reflecting layer 6, and consequently, the semiconductor device 105 shown in FIG. 32 is obtained. The electromagnetic wave reflecting layer 6 is electrically connected to the ground electrode on the circuit board 2.

As described above, in the semiconductor device 105 according to the fifth embodiment of the present invention, the upper surface 1a of the semiconductor package 1 on a side remote from the surface bonded to the circuit board 2 has an uneven shape. This causes, when the upper surface 1a of the semiconductor package 1 is covered with the electromagnetic wave absorbing layer 5, the electromagnetic wave absorbing layer 5 to enter the irregularities of the upper surface 1a, which increases the contact area between the semiconductor package 1 and the electromagnetic wave absorbing layer 5 as well as exhibiting the anchor effect and consequently, increases the adhesion strength between the semiconductor package 1 and the electromagnetic wave absorbing layer 5. Further, the electromagnetic wave absorbing layer 5 formed on the upper surface 1a of the semiconductor package 1 also has an uneven shape on the upper surface, which similarly increases the contact area between the electromagnetic wave absorbing layer 5 and the electromagnetic wave reflecting layer 6 as well as exhibiting the anchor effect and consequently, increases the adhesion strength between the electromagnetic wave absorbing layer 5 and the electromagnetic wave reflecting layer 6.

F. Sixth Embodiment

Figure 37:
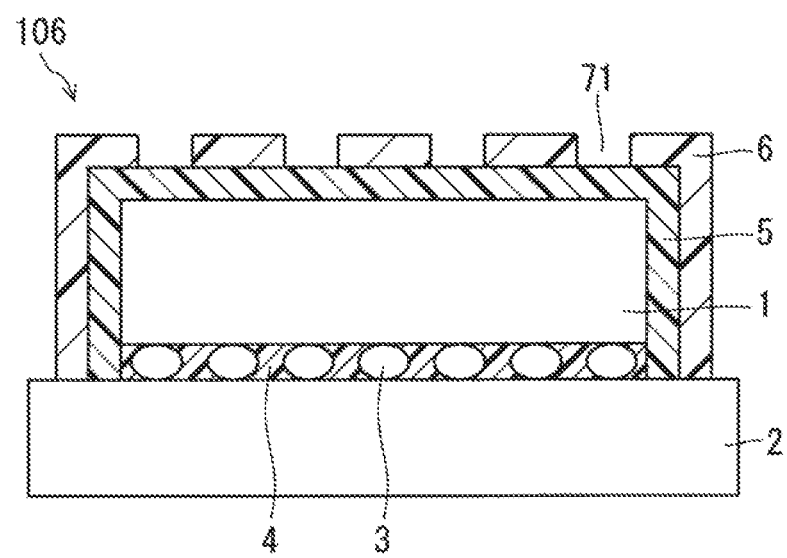
FIG. 37 is a cross-sectional view of a semiconductor device according to a sixth embodiment of the present invention.

FIG. 37 is a cross-sectional view of a semiconductor device 106 according to a sixth embodiment of the present invention. The semiconductor device 106 differs from the semiconductor devices according to the first, second, third, fourth, and fifth embodiments in that the electromagnetic wave reflecting layer 6 includes a humidity control opening 71 on the upper surface of the semiconductor package 1. The humidity control opening 71 passes through the electromagnetic wave reflecting layer 6, thereby exposing the electromagnetic wave absorbing layer 5 through the humidity control opening 71. Note that a diameter of the humidity control opening 71 is, for example, 0.1 mm.

FIG. 38, FIG. 39, FIG. 40, and FIG. 41 are each a cross-sectional view of a semiconductor device 106, showing a method for manufacturing the semiconductor device 106. Hereinafter, the method for manufacturing the semiconductor device 106 will be described with reference to these drawings.

Figure 38:
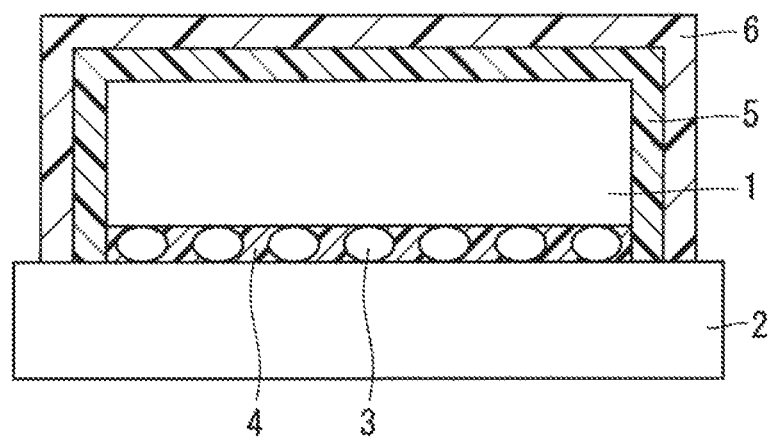
FIG. 38 is a cross-sectional view of the semiconductor device according to the sixth embodiment of the present invention, showing a manufacturing process of the semiconductor device.

FIG. 38 is a cross-sectional view showing a state where the electromagnetic wave reflecting layer 6 is formed on the electromagnetic wave absorbing layer 5, and FIG. 38 is the same as FIG. 6. In other words, a manufacturing process of the semiconductor device 106 is the same as the manufacturing process of the semiconductor device 101 according to the first embodiment shown in FIGS. 2, 3, 4, and 5.

Figure 39:
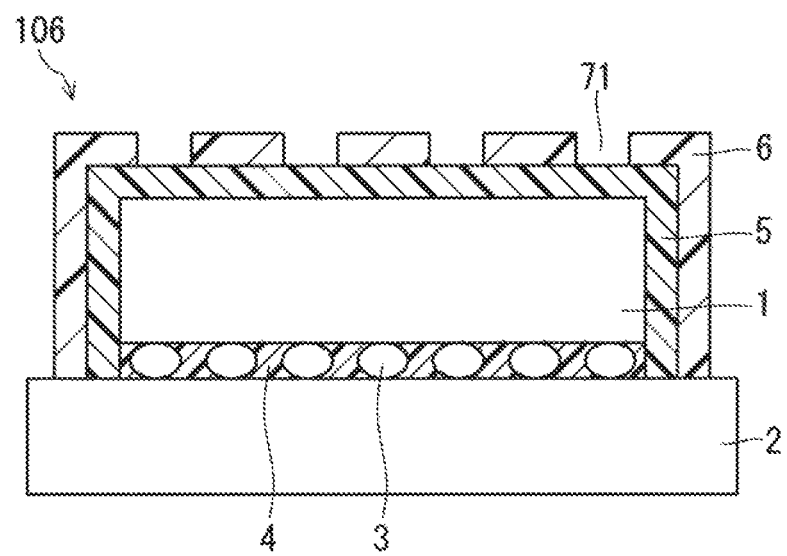
FIG. 39 is a cross-sectional view of the semiconductor device according to the sixth embodiment of the present invention, showing the manufacturing process of the semiconductor device.
Figure 40:
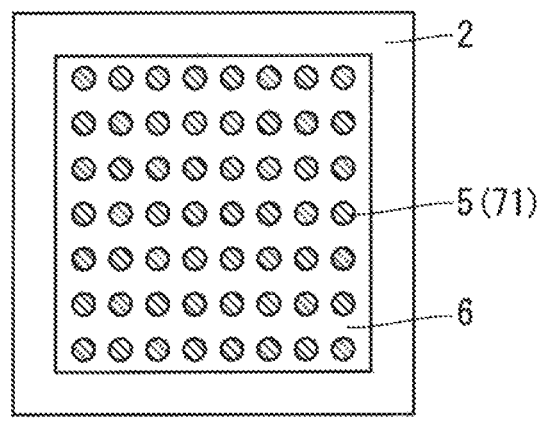
FIG. 40 is a top view of the semiconductor device according to the sixth embodiment of the present invention.
Figure 41:
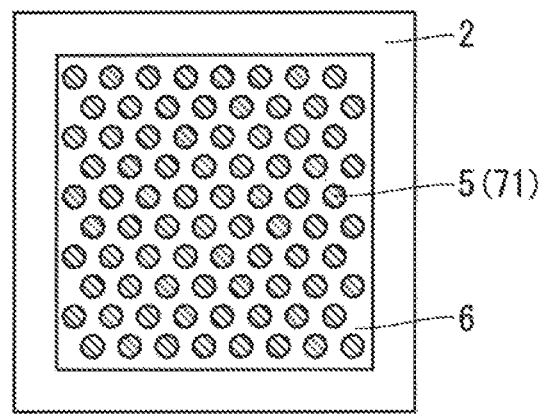
FIG. 41 is a top view of the semiconductor device according to the sixth embodiment of the present invention.

Thereafter, as shown in FIG. 39, a plurality of the humidity control openings 71 are formed through the electromagnetic wave reflecting layer 6, and consequently, the semiconductor device 106 is completed. Here, the plurality of humidity control openings 71 are formed, but at least one humidity control opening 71 only needs to be formed. Further, as shown in FIG. 40 and FIG. 41, it is preferable that the humidity control openings 71 be arranged in a lattice pattern. FIG. 40 and FIG. 41 are each a top view of the semiconductor device 106.

Any electromagnetic wave cannot pass through an opening having a diameter smaller than the wavelength of the electromagnetic wave. For example, when the diameter of the humidity control opening 71 is 0.1 mm, an electromagnetic wave with a frequency of 3 THz or less cannot pass through the humidity control opening 71, and when the diameter of the humidity control opening 71 is 0.5 mm, an electromagnetic wave with a frequency of 600 GHz or less cannot pass through the humidity control opening 71. Therefore, determining the size of the humidity control opening 71 as described above prevents an electromagnetic wave shielding capability from deteriorating due to the humidity control opening 71.

According to the semiconductor device 106, excessive moisture between the electromagnetic wave absorbing layer 5 and the electromagnetic wave reflecting layer 6 is released through the humidity control opening 71, which makes it possible to prevent the electromagnetic wave absorbing layer 5 and the electromagnetic wave reflecting layer 6 from being separated off.

As described above, the semiconductor device 106 according to the sixth embodiment of the present invention includes, in addition to the configuration of the semiconductor device 101 according to the first embodiment, the humidity control opening 71 formed through the electromagnetic wave reflecting layer 6. Excessive moisture between the electromagnetic wave absorbing layer 5 and the electromagnetic wave reflecting layer 6 is released to the outside through the humidity control opening 71, which makes it possible to prevent the electromagnetic wave absorbing layer 5 and the electromagnetic wave reflecting layer 6 from being separated off.

Note that the present invention can be implemented by any combination of the embodiments within the scope of the present invention, and each of the embodiments can be modified or omitted as appropriate.

EXPLANATION OF REFERENCE SIGNS

1: semiconductor package
2: circuit board
3: solder
4: underfill resin
5: electromagnetic wave absorbing layer
6: electromagnetic wave reflecting layer
7: metal film
8: metal plate
9: board pattern
51: opening
61: heat dissipating via
71: humidity control opening
101, 102, 103, 104: semiconductor device

The invention claimed is:

1. A semiconductor device comprising:
a semiconductor package bonded onto a circuit board;
a first layer including an electromagnetic wave absorbing layer covering surfaces of the semiconductor package other than a surface bonded to the circuit board; and
a second layer including an electromagnetic wave reflecting layer covering the electromagnetic wave absorbing layer on a side remote from the semiconductor package,
an opening in the first layer in a portion of the first layer where the electromagnetic wave absorbing layer is not formed,
wherein
the electromagnetic wave absorbing layer is made of resin containing magnetic particles or carbon,
the opening is provided with a heat dissipating via that is made of resin containing conductive particles, and
the electromagnetic wave reflecting layer is made of the resin containing the conductive particles.

2. The semiconductor device according to claim 1, wherein
a difference in solubility parameter between the resin making up the electromagnetic wave absorbing layer and the resin making up the electromagnetic wave reflecting layer is equal to or less than 2.

3. The semiconductor device according to claim 1, wherein
the electromagnetic wave absorbing layer has a thickness that makes a phase difference between an electromagnetic wave that impinges on the electromagnetic wave absorbing layer from the semiconductor package and an electromagnetic wave that is reflected off the electromagnetic wave reflecting layer and impinges on the electromagnetic wave absorbing layer again to be 180°.

4. The semiconductor device according to claim 1, further comprising a metal film disposed between the semiconductor package and the heat dissipating via in the opening.

5. The semiconductor device according to claim 1, further comprising a metal plate disposed between a surface of the electromagnetic wave absorbing layer having the opening and the electromagnetic wave reflecting layer.

6. The semiconductor device according to claim 1, wherein
a surface of the semiconductor package on a side remote from the surface bonded to the circuit board has an uneven shape.

\* \* \* \* \*